United States Patent
Tejasvi et al.

(10) Patent No.: US 11,894,316 B2
(45) Date of Patent: Feb. 6, 2024

(54) CONTAINING ELECTROMAGNETIC INTERFERENCE RADIATION IN LIDLESS SEMICONDUCTOR PACKAGES

(71) Applicant: Juniper Networks, Inc., Sunnyvale, CA (US)

(72) Inventors: Mokshith Tejasvi, Bangalore (IN); Saravanan Govindasamy, Bangalore (IN); Girish Muddenahalli Haleshappa, Bangalore (IN); Raveen Jagadeesan, Bangalore (IN)

(73) Assignee: Juniper Networks, Inc., Sunnyvale, CA (US)

( * ) Notice: Subject to any disclaimer, the term of this patent is extended or adjusted under 35 U.S.C. 154(b) by 130 days.

(21) Appl. No.: 17/548,747

(22) Filed: Dec. 13, 2021

(65) Prior Publication Data

US 2023/0187375 A1 Jun. 15, 2023

(51) Int. Cl.
*H01L 23/552* (2006.01)
*H01L 23/12* (2006.01)
*H01L 25/18* (2023.01)

(52) U.S. Cl.
CPC ............ *H01L 23/552* (2013.01); *H01L 23/12* (2013.01); *H01L 25/18* (2013.01)

(58) Field of Classification Search
CPC ........ H01L 23/552; H01L 23/12; H01L 25/18
See application file for complete search history.

(56) References Cited

U.S. PATENT DOCUMENTS

| | | |
|---|---|---|
| 8,986,806 B1 | 3/2015 | Baloglu et al. |
| 2010/0084180 A1* | 4/2010 | Chiang ............... H05K 9/0032 361/818 |
| 2014/0252634 A1* | 9/2014 | Hung ..................... H01L 25/50 257/773 |
| 2016/0037692 A1 | 2/2016 | Zhang et al. |
| 2018/0040568 A1* | 2/2018 | Jian ....................... H01L 25/16 |
| 2019/0103359 A1* | 4/2019 | Kong ..................... H01L 25/16 |
| 2019/0237371 A1 | 8/2019 | Ahmad et al. |

OTHER PUBLICATIONS

Extended European Search Report for Application No. EP22154496.8, dated Jan. 5, 2023, 11 pages.

* cited by examiner

*Primary Examiner* — Peniel M Gumedzoe
(74) *Attorney, Agent, or Firm* — Harrity & Harrity, LLP (57) ABSTRACT

A semiconductor package may include a substrate, an application-specific integrated circuit (ASIC) provided on a first portion of a surface of the substrate, a memory device provided on a second portion of the surface of the substrate, and a stiffener plate provided on a third portion of the surface of the substrate. The stiffener plate may be spaced from and may surround the ASIC and the memory device. The semiconductor package may include an electromagnetic interference (EMI) absorber provided on a fourth portion of the surface of the substrate. The EMI absorber may be provided between the stiffener plate and the ASIC and the memory device. The EMI absorber may surround the ASIC and the memory device and may block EMI radiation generated by the ASCI and the memory device.

20 Claims, 8 Drawing Sheets

CONTAINING ELECTROMAGNETIC INTERFERENCE RADIATION IN LIDLESS SEMICONDUCTOR PACKAGES

BACKGROUND

A lidless semiconductor package provides improved thermal performance over a heat spreader-based (e.g., lidded) semiconductor package. The lidless semiconductor package also costs less to manufacture since a heat spreader (e.g., a lid) is not used in a lidless semiconductor package. In the lidless semiconductor package, exposure of a semiconductor device (e.g., an application-specific integrated circuit (ASIC)) allows for direct contact between the semiconductor device and a heat sink, which increases the thermal performance of the semiconductor device.

SUMMARY

Some implementations described herein relate to a semiconductor package. The semiconductor package may include a substrate, a semiconductor device provided on a first portion of a surface of the substrate, and a stiffener plate provided on a second portion of the surface of the substrate. The second portion may be separate from the first portion, and the stiffener plate may be configured to be spaced from and to surround the semiconductor device. The semiconductor package may include an electromagnetic interference absorber provided on a third portion of the surface of the substrate. The third portion may be separate from the first portion and the second portion, and the electromagnetic interference absorber may be configured to be provided between the semiconductor device and the stiffener plate.

Some implementations described herein relate to an electromagnetic interference absorber for a semiconductor package. The electromagnetic interference absorber may include a body portion configured to be provided on a first portion of a surface of a substrate that includes a semiconductor device provided on a second portion of the surface of the substrate and a stiffener plate provided on a third portion of the surface of the substrate. The first portion, the second portion, and the third portion may be separate. The stiffener plate may be configured to be spaced from and to surround the semiconductor device. The body portion may be configured to be provided between the semiconductor device and the stiffener plate. The electromagnetic interference absorber may include a main opening provided in the body portion and configured to receive the semiconductor device.

Some implementations described herein relate to a semiconductor package. The semiconductor package may include a substrate, an ASIC provided on a first portion of a surface of the substrate, a memory device provided on a second portion of the surface of the substrate, and a stiffener plate provided on a third portion of the surface of the substrate. The stiffener plate is configured to be spaced from and to surround the ASIC and the memory device. The semiconductor package may include an electromagnetic interference absorber provided on a fourth portion of the surface of the substrate. The first portion, the second portion, third portion, and fourth portion may be separate. The electromagnetic interference absorber may be configured to be provided between the stiffener plate and the ASIC and the memory device. The electromagnetic interference absorber may be configured to surround the ASIC and the memory device and to block electromagnetic interference radiation generated by the ASIC and the memory device.

DETAILED DESCRIPTION

The following detailed description of example implementations refers to the accompanying drawings. The same reference numbers in different drawings may identify the same or similar elements.

While a lidless semiconductor package achieves improved thermal performance, a higher-speed lidless semiconductor package requires providing additional components on a substrate supporting the semiconductor device. The additional components may densely populate the substrate and may be susceptible to electromagnetic interference (EMI) radiation generated by the semiconductor device. EMI is a disturbance generated by an external source that affects an electrical circuit (e.g., the additional components on the substrate) by electromagnetic induction, electrostatic coupling, or conduction. The disturbance may degrade the performance of the electrical circuit or even stop the electrical circuit from functioning. In the case of a network data path, such effects may increase an error rate in the data or may result in a total loss of the data.

Current techniques for containing EMI radiation generated by a semiconductor device utilize an EMI absorber on a portion of the substrate supporting the semiconductor device. However, the EMI absorber is unable to utilize the space occupied by the additional components that densely populate the substrate. Thus, the current techniques for containing EMI radiation generated by the semiconductor device consume computing resources (e.g., processing resources, memory resources, communication resources, and/or the like), networking resources, and/or the like associated with degrading or rendering inoperable the additional components on the substrate due, increasing an error rate in network data due to the degraded or inoperable additional components, losing network data due to the degraded or inoperable additional components, and/or the like.

Some implementations described herein relate to a lidless semiconductor package that contains EMI radiation. For example, the lidless semiconductor package may include a substrate, a semiconductor device provided on a first portion of a surface of the substrate, and a stiffener plate provided on a second portion of the surface of the substrate. The second portion may be separate from the first portion, and the stiffener plate may be configured to be spaced from and to surround the semiconductor device. The semiconductor package may include an EMI absorber provided on a third portion of the surface of the substrate. The third portion may be separate from the first portion and the second portion, and the EMI absorber may be configured to be provided between the semiconductor device and the stiffener plate.

In this way, the lidless semiconductor package may contain EMI radiation. For example, the lidless semiconductor package may provide an EMI absorber around a semiconductor device of the lidless semiconductor package. The EMI absorber may not consume space of a substrate supporting the semiconductor device and may accommodate additional components supported by the substrate. The EMI absorber may absorb EMI radiation generated by the semiconductor device and may reduce such EMI radiation from degrading or rendering inoperable the additional components supported by the substrate. Thus, the lidless semiconductor package conserves computing resources, networking resources, and/or the like that would otherwise have been consumed by degrading or rendering inoperable the additional components on the substrate, increasing an error rate in network data due to the degraded or inoperable additional components, losing network data due to the degraded or inoperable additional components, and/or the like.

FIGS. 1A-1F are diagrams of an example 100 associated with a lidless semiconductor package 105 that contains EMI radiation. As shown in FIGS. 1A-1F, the lidless semiconductor package 105 may include a substrate 110, a stiffener plate 115, and one or more semiconductor devices (e.g., an ASIC 120 and/or memory devices 125). Further details of the substrate 110, the stiffener plate 115, the ASIC 120, and the memory device 125 are provided elsewhere herein.

Figure 1A:
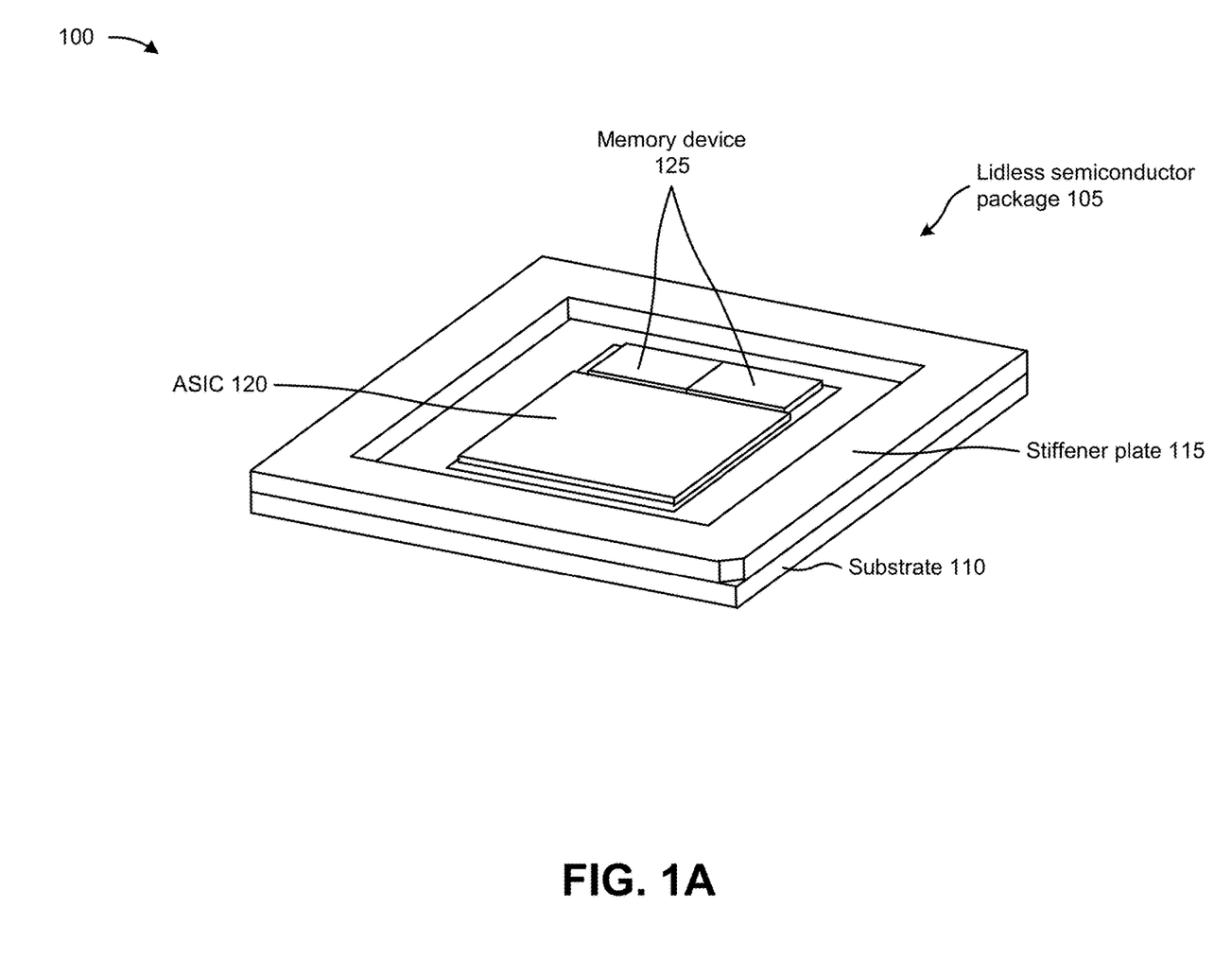
FIGS. 1A-1F are diagrams of an example lidless semiconductor package that contains electromagnetic interference (EMI) radiation.

As shown in FIG. 1A, the stiffener plate 115 may be provided on a first portion (e.g., a perimeter portion) of a surface (e.g., a top surface) of the substrate 110, and the ASIC 120 and the memory devices 125 may be provided on a second portion (e.g., a central portion) of the surface of the substrate 110. The second portion of the substrate 110 may be separate from the first portion of the substrate 110. The stiffener plate 115 may be spaced from and may surround the ASIC 120 and the memory devices 125.

The substrate 110 may support the components (e.g., the stiffener plate 115, the ASIC 120, and the memory devices 125) of the lidless semiconductor package 105. The substrate 110 may include a conductive or semi-conductive material (e.g., silicon, aluminum, copper, and/or the like), may include a printed circuit board material, and/or the like. The substrate 110 may be sized and shaped to support one or more lidless semiconductor packages 105. For example, the substrate 110 may support multiple groups of stiffener plates 115, ASICs 120, and memory devices 125 to provide multiple lidless semiconductor packages 105.

The stiffener plate 115 may include a frame-like structure that does not cover a central portion of the substrate 110, and may reinforce the substrate 110 by adding a reinforcing border around the ASIC 120 and the memory devices 125. In this way, the stiffener plate 115 may enable the substrate 110 to adequately support the ASIC 120 and the memory devices 125 without bending or flexing. The stiffener plate 115 may be formed from a variety of materials, such as silicon, aluminum, copper, a polymeric material (e.g., silicone rubber mixed with aluminum particles and zinc oxide), and/or the like. The stiffener plate 115 may be sized and shaped based on sizes and shaped of the ASIC 120 and the memory device 125. For example, the stiffener plate 115 may be sized and shaped so that the stiffener plate 115 does not cover the central portion of the substrate 110 and so that the stiffener plate 115 is spaced from and surrounds the ASIC 120 and the memory devices 125.

The ASIC 120 may include is an integrated circuit chip that is customized for a particular use, rather than intended for a general-purpose use. In some implementations, the ASIC 120 may be replaced with one or more other semiconductor devices, such as an application-specific standard product (ASSP) chip, an industry standard integrated circuit chip, and/or the like. The ASIC 120 may be formed from a variety of materials, such as, for example, a metal-oxide-semiconductor (MOS) material. The ASIC 120 may be sized and shaped based on a functionality of the ASIC 120 and based on the size and the shape of the stiffener plate 115. For example, the ASIC 120 may be sized and shaped so that the stiffener plate 115 is spaced from and surrounds the ASIC 120.

Each memory device 125 may include a device that is used to store information for use in a computer or related computer hardware and digital electronic devices. In some implementations, each memory device 125 may include high bandwidth memory (HBM) device that provides a high-speed computer memory interface for three dimensional-stacked synchronous dynamic random-access memory (SDRAM). Each memory device 125 may be sized and shaped based on a functionality of each memory device 125 and based on the size and the shape of the stiffener plate 115. For example, the memory devices 125 may be sized and shaped so that the stiffener plate 115 is spaced from and surrounds the memory devices 125. Although FIG. 1A shows two memory devices 125, in some implementations, the lidless semiconductor package 105 may include one memory device 125 or more than two memory devices 125.

Figure 1B:
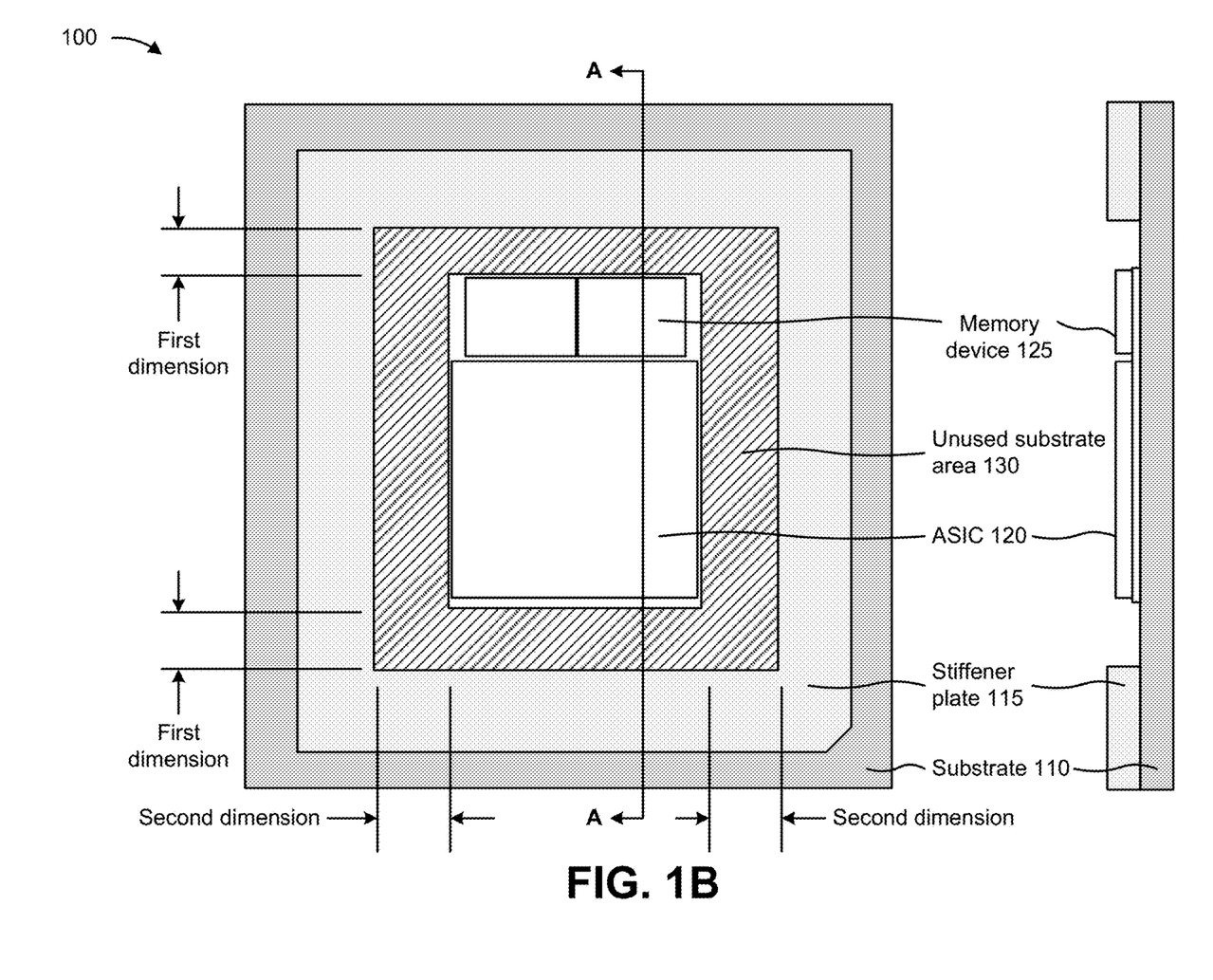

As shown in FIG. 1B, due to the stiffener plate 115 being spaced from and surrounding the ASIC 120 and the memory devices 125, an unused substrate area 130 (e.g., shown in cross hatching) of the surface of the substrate 110 may be formed in the lidless semiconductor package 105. The unused substrate area 130 may include space of the substrate 110 that is not occupied by additional components that densely populate the substrate 110. As further shown, the unused substrate area 130 may include a first dimension and a second dimension that depend on the sizes and shaped of the stiffener plate 115, the ASIC 120, and/or the memory devices 125. In some implementations, the first dimension may include a range from approximately two millimeters (2 mm) to approximately fifteen millimeters (15 mm). In some implementations, the second dimension may include a range from approximately two millimeters (2 mm) to approximately eighteen millimeters (18 mm). The first dimension and/or the second dimension may include different size ranges depending on the sizes and shaped of the stiffener plate 115, the ASIC 120, and the memory devices 125.

Figure 1C:
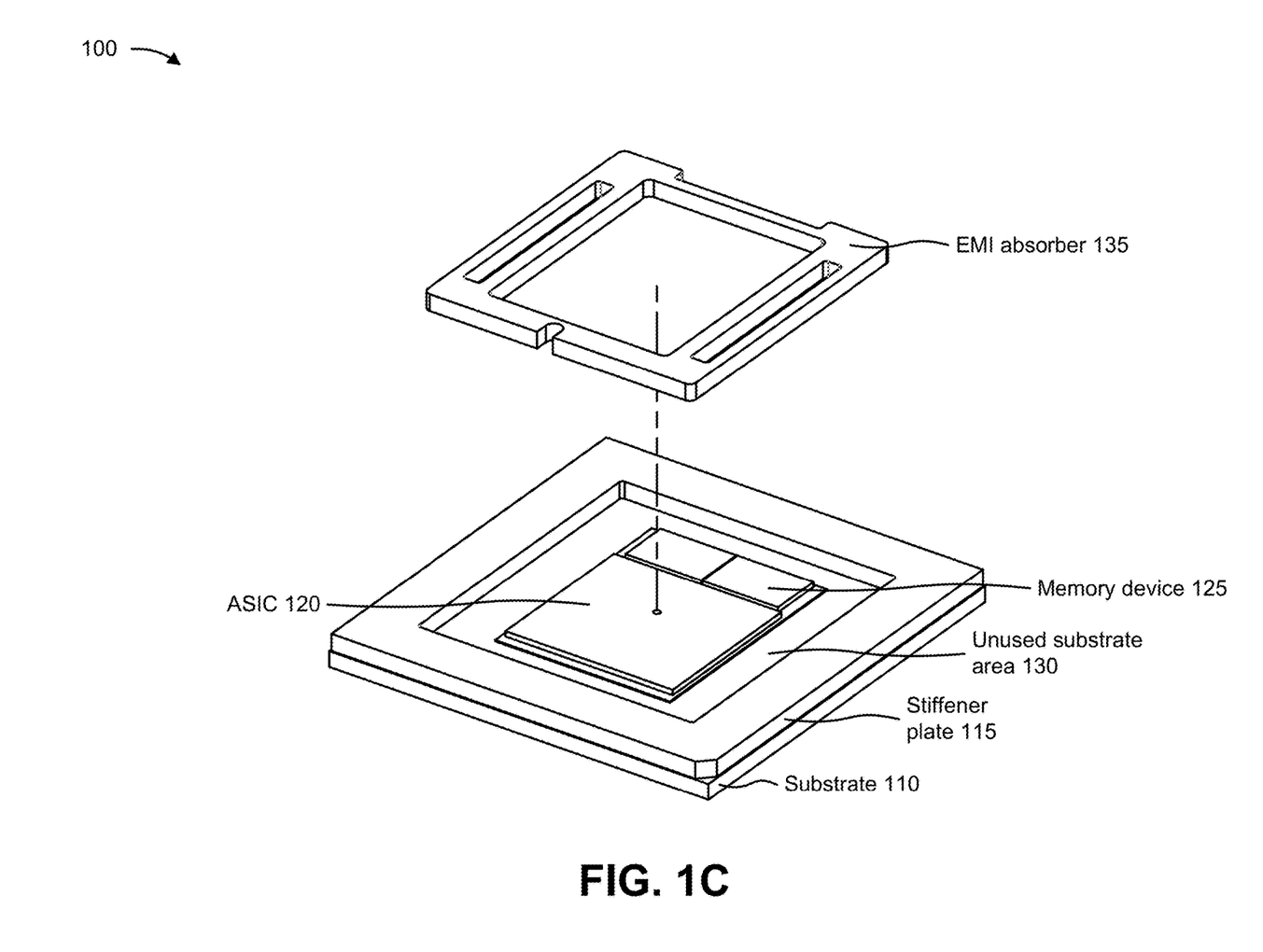

As shown in FIG. 1C, the unused substrate area 130 may be utilized to support an EMI absorber 135 on the surface of the substrate 110. The EMI absorber 135 may be provided between the semiconductor device (e.g., the ASIC 120 and the memory devices 125) and the stiffener plate 115. In some implementations, the EMI absorber 135 may absorb EMI radiation generated by the ASIC 120 and/or the memory devices 125. In some implementations, the EMI absorber 135 may reduce EMI radiation, generated by the ASIC 120 and/or the memory devices 125, from reaching one or more components (not shown) provided on the surface of the substrate 110. The EMI absorber 135 may be sized and shaped to fit within the unused substrate area 130 of the substrate 110. The EMI absorber 135 may be formed from a variety of materials, such as a metal material, a carbon material, a ceramic material, a cement material, a polymer material, a hybrid material, and/or the like.

In some implementations, the EMI absorber 135 may block EMI radiation at a frequency in a range from approximately two gigahertz (2 GHz) to approximately forty gigahertz (40 GHz). In some implementations, the EMI absorber 135 may block at least ten decibels (10 dBs) more of EMI radiation than a lidless semiconductor package without the EMI absorber 135. In some implementations, a thickness of the EMI absorber 135 may depend upon a quantity of EMI radiation to be generated by the ASIC 120 and/or the memory devices 125.

Figure 1D:
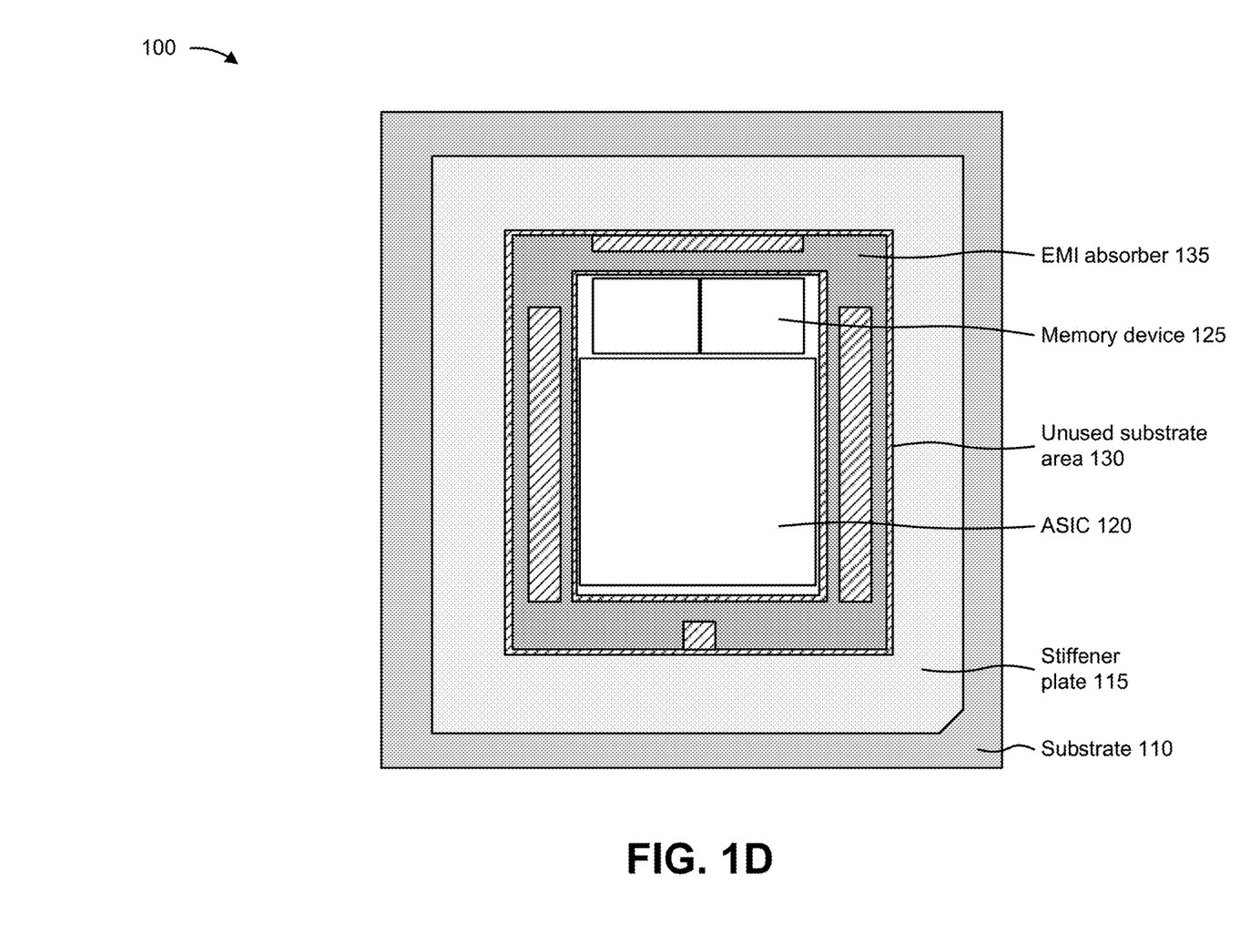

As shown in FIG. 1D, the EMI absorber 135 may be provided on the unused substrate area 130 between the stiffener plate 115 and the ASIC 120 and the memory devices 125. The EMI absorber 135 may include a frame-like structure that does not cover the ASIC 120 and the memory devices 125, but that does substantially cover the unused substrate area 130. In some implementations, the EMI absorber 135 may include one or more openings to expose one or more additional components provided on the substrate 110 (e.g., if provided on the unused substrate area 130). In some implementations, the one or more openings may be omitted from the EMI absorber 135 if the unused substrate area 130 does not include additional components.

Figure 1E:
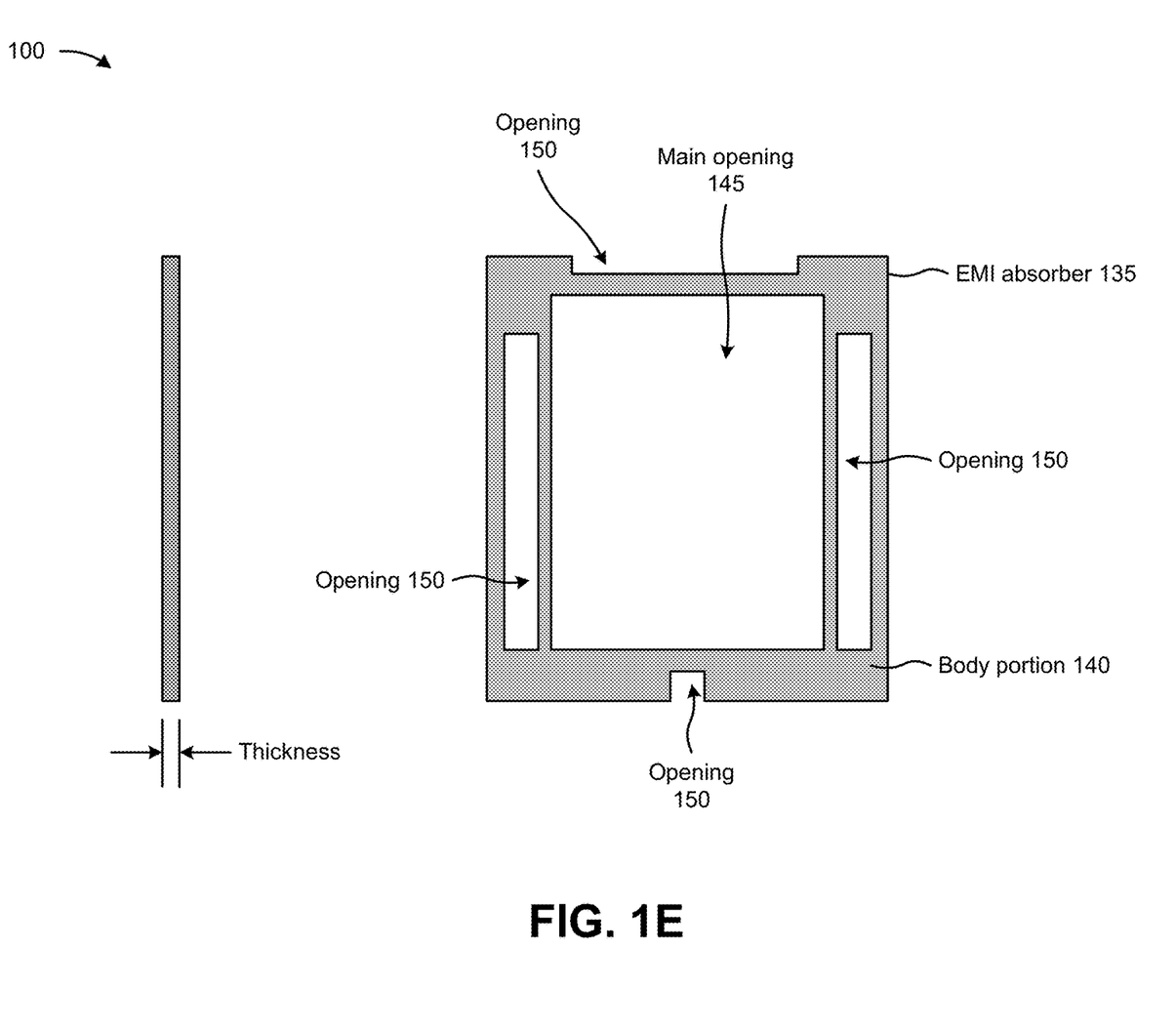

As shown in FIG. 1E, the EMI absorber 135 may include a body portion 140, a main opening 145 provided in the body portion 140, and one or more openings 150 provided in the body portion 140. The body portion 140 may surround the ASIC 120 and the memory devices 125. The body portion 140 may absorb EMI radiation generated by the ASIC 120 and/or the memory devices 125. The body portion 140 may reduce EMI radiation, generated by the ASIC 120 and/or the memory devices 125, from reaching one or more components provided on the surface of the substrate 110. The body portion 140 may be formed from a variety of materials, such as a metal material, a carbon material, a ceramic material, a cement material, a polymer material, a hybrid material, and/or the like. In some implementations, the body portion 140 may block EMI radiation at a frequency in a range from approximately two gigahertz (2 GHz) to approximately forty gigahertz (40 GHz). In some implementations, the body portion 140 may block at least ten decibels (10 dBs) more of EMI radiation than a lidless semiconductor package without the EMI absorber 135.

The main opening 145 may receive and expose top portions of the ASIC 120 and the memory devices 125. The one or more openings 150 may receive one or more corresponding components provided on the unused substrate area 130. As further shown in FIG. 1E, the EMI absorber 135 may include a thickness that depends upon a quantity of EMI radiation to be generated by the ASIC 120 and/or the memory devices 125. In some implementations, the thickness of the EMI absorber 135 may include a range from approximately 0.5 millimeters (0.5 mm) to approximately ten millimeters (10 mm).

Figure 1F:
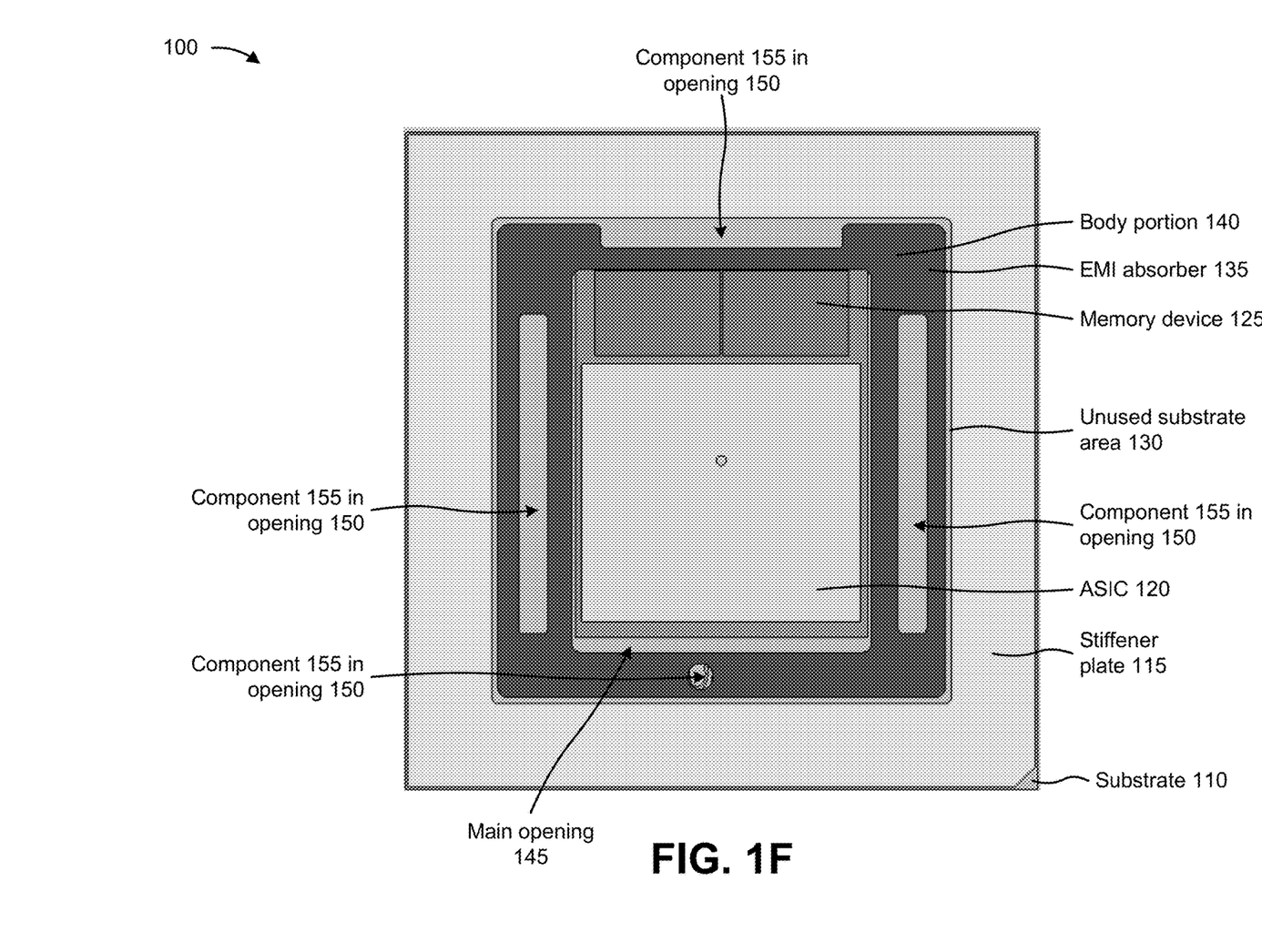

As shown in FIG. 1F, the ASIC 120 and the memory devices 125 may be provided in the main opening 145 of the body portion 140 of the EMI absorber 135. In some implementations, one or more components 155 may be provided on the unused substrate area 130. The one or more components 155 may be provided in the one or more openings 150 of the body portion 140 of the EMI absorber 135. In this way, the EMI absorber 135 may shield the one or more components 155 from EMI radiation generated by the ASIC 120 and/or the memory devices 125.

In this way, the lidless semiconductor package 105 may contain EMI radiation. For example, the lidless semiconductor package 105 may provide the EMI absorber 135 around the semiconductor device (e.g., the ASIC 120 and/or the memory device 125) of the lidless semiconductor package 105. The EMI absorber 135 may not consume space of the substrate 110 supporting the semiconductor device and may accommodate the additional components supported by the substrate 110. The EMI absorber 135 may absorb EMI radiation generated by the semiconductor device and may reduce such EMI radiation from degrading or rendering inoperable the additional components supported by the substrate 110. Thus, the lidless semiconductor package 105 conserves computing resources, networking resources, and/or the like that would otherwise have been consumed by degrading or rendering inoperable the additional components on the substrate 110, increasing an error rate in network data due to the degraded or inoperable additional components, losing network data due to the degraded or inoperable additional components, and/or the like.

As indicated above, FIGS. 1A-1F are provided as an example. Other examples may differ from what is described with regard to FIGS. 1A-1F. The number and arrangement of devices shown in FIGS. 1A-1F are provided as an example. In practice, there may be additional devices, fewer devices, different devices, or differently arranged devices than those shown in FIGS. 1A-1F. Furthermore, two or more devices shown in FIGS. 1A-1F may be implemented within a single device, or a single device shown in FIGS. 1A-1F may be implemented as multiple, distributed devices. Additionally, or alternatively, a set of devices (e.g., one or more devices) shown in FIGS. 1A-1F may perform one or more functions described as being performed by another set of devices shown in FIGS. 1A-1F.

Figure 2:
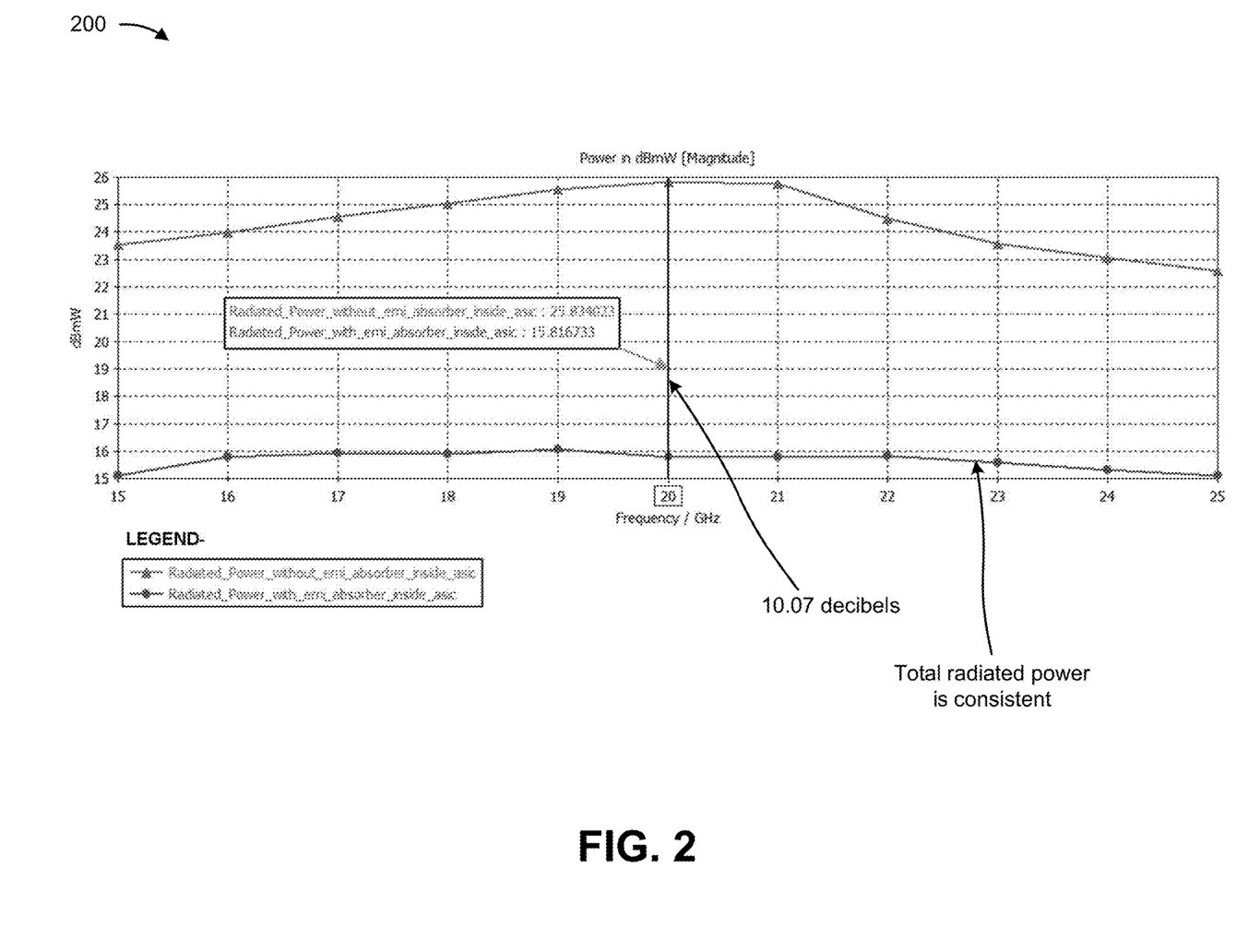
FIG. 2 is a graph depicting a performance of the example lidless semiconductor package of FIG. 1, with and without an EMI absorber.

FIG. 2 is a graph 200 depicting a performance of the example lidless semiconductor package 105 of FIG. 1. As shown in FIG. 2, a first line (e.g., at the top) may be associated with power radiated by the lidless semiconductor package 105 without the EMI absorber 135. The first line may fluctuate based on frequency and may include a power of 25.834023 decibels megawatts (dBmW) at a frequency level of 20 gigahertz (GHz). As further shown, a second line (e.g., at the bottom) may be associated with power radiated by the lidless semiconductor package 105 with the EMI absorber 135. The second line may not fluctuate with frequency (e.g., indicating a consistent total radiated power) and may include a power of 15.816733 dBmW at the frequency level of 20 GHz. The difference between the maximum powers is 10.07 decibels at the frequency level of 20 GHz. Therefore, the EMI absorber 135 may block at least ten decibels (10 dB) more of EMI radiation than the lidless semiconductor package 105 without the EMI absorber 135. The powers and frequencies depicted in FIG. 2 are provided as examples and may be different in other implementations.

Figure 3:
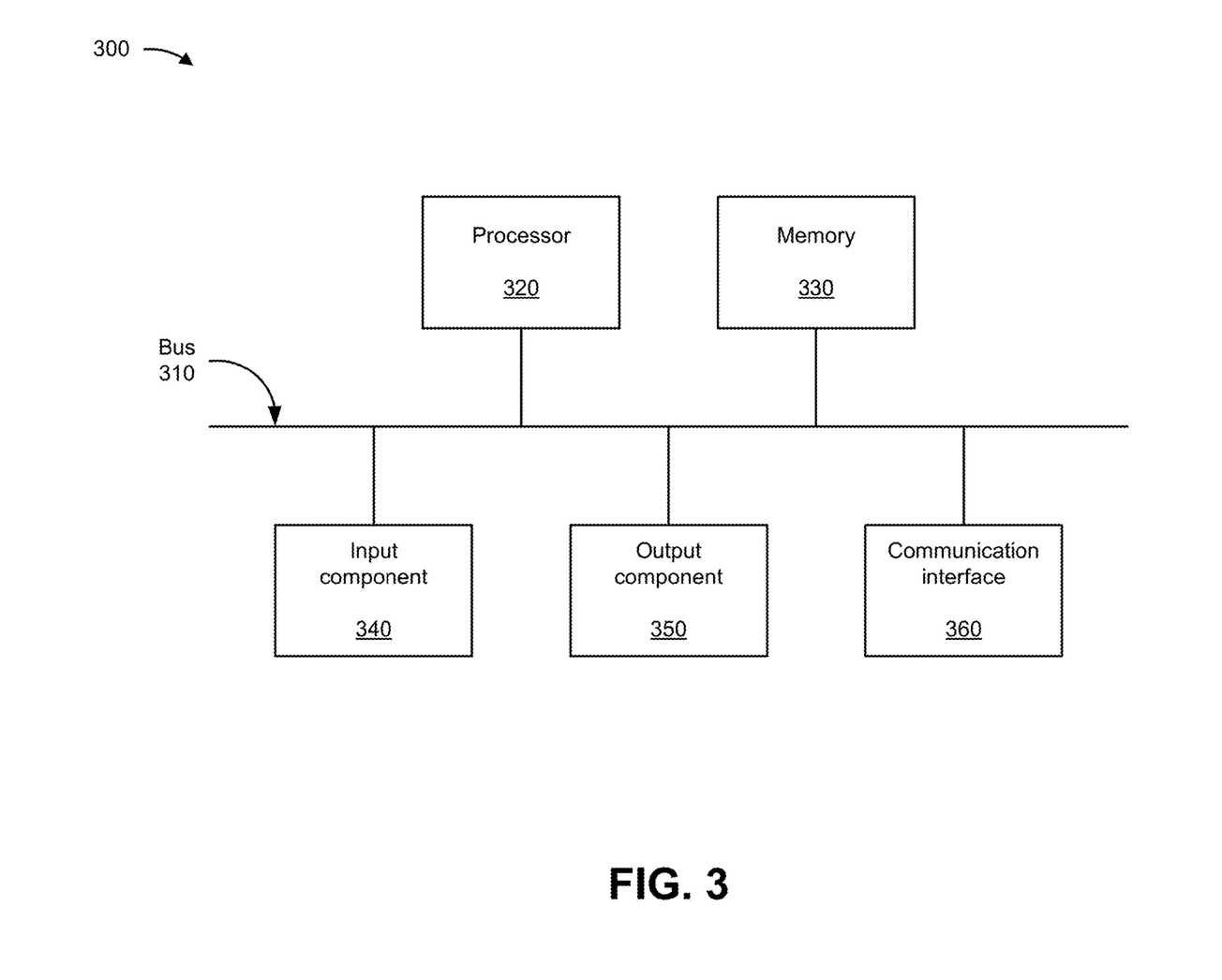
FIG. 3 is a diagram of example components of the example lidless semiconductor package of FIG. 1.

FIG. 3 is a diagram of example components that may be included in a device 300, which may correspond to the lidless semiconductor package 105. In some implementations, the lidless semiconductor package 105 may include one or more devices 300 and/or one or more components of the device 300. As shown in FIG. 3, the device 300 may include a bus 310, a processor 320, a memory 330, an input component 340, an output component 350, and a communication interface 360.

The bus 310 includes one or more components that enable wired and/or wireless communication among the components of the device 300. The bus 310 may couple together two or more components of FIG. 3, such as via operative coupling, communicative coupling, electronic coupling, and/or electric coupling. The processor 320 includes a central processing unit, a graphics processing unit, a microprocessor, a controller, a microcontroller, a digital signal processor, a field-programmable gate array, an application-specific integrated circuit, and/or another type of processing component. The processor 320 is implemented in hardware, firmware, or a combination of hardware and software. In some implementations, the processor 320 includes one or more processors capable of being programmed to perform one or more operations or processes described elsewhere herein.

The memory 330 includes volatile and/or nonvolatile memory. For example, the memory 330 may include random access memory (RAM), read only memory (ROM), a hard disk drive, and/or another type of memory (e.g., a flash memory, a magnetic memory, and/or an optical memory). The memory 330 may include internal memory (e.g., RAM, ROM, or a hard disk drive) and/or removable memory (e.g., removable via a universal serial bus connection). The memory 330 may be a non-transitory computer-readable medium. The memory 330 stores information, instructions, and/or software (e.g., one or more software applications) related to the operation of the device 300. In some implementations, the memory 330 includes one or more memories that are coupled to one or more processors (e.g., the processor 320), such as via the bus 310.

The input component 340 enables the device 300 to receive input, such as user input and/or sensed input. For example, the input component 340 may include a touch screen, a keyboard, a keypad, a mouse, a button, a microphone, a switch, a sensor, a global positioning system sensor, an accelerometer, a gyroscope, and/or an actuator. The output component 350 enables the device 300 to provide output, such as via a display, a speaker, and/or a light-emitting diode. The communication interface 360 enables the device 300 to communicate with other devices via a wired connection and/or a wireless connection. For example, the communication interface 360 may include a receiver, a transmitter, a transceiver, a modem, a network interface card, and/or an antenna.

The device 300 may perform one or more operations or processes described herein. For example, a non-transitory computer-readable medium (e.g., the memory 330) may store a set of instructions (e.g., one or more instructions or code) for execution by the processor 320. The processor 320 may execute the set of instructions to perform one or more operations or processes described herein. In some implementations, execution of the set of instructions, by one or more processors 320, causes the one or more processors 320 and/or the device 300 to perform one or more operations or processes described herein. In some implementations, hard-wired circuitry may be used instead of or in combination with the instructions to perform one or more operations or processes described herein. Additionally, or alternatively, the processor 320 may be configured to perform one or more operations or processes described herein. Thus, implementations described herein are not limited to any specific combination of hardware circuitry and software.

The number and arrangement of components shown in FIG. 3 are provided as an example. The device 300 may include additional components, fewer components, different components, or differently arranged components than those shown in FIG. 3. Additionally, or alternatively, a set of components (e.g., one or more components) of the device 300 may perform one or more functions described as being performed by another set of components of the device 300.

The foregoing disclosure provides illustration and description but is not intended to be exhaustive or to limit the implementations to the precise form disclosed. Modifications may be made in light of the above disclosure or may be acquired from practice of the implementations.

As used herein, the term "component" is intended to be broadly construed as hardware, firmware, or a combination of hardware and software. It will be apparent that systems and/or methods described herein may be implemented in different forms of hardware, firmware, and/or a combination of hardware and software. The actual specialized control hardware or software code used to implement these systems and/or methods is not limiting of the implementations. Thus, the operation and behavior of the systems and/or methods are described herein without reference to specific software code—it being understood that software and hardware can be used to implement the systems and/or methods based on the description herein.

Although particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set.

No element, act, or instruction used herein should be construed as critical or essential unless explicitly described as such. Also, as used herein, the articles "a" and "an" are intended to include one or more items and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, a combination of related and unrelated items, and/or the like), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of").

In the preceding specification, various example embodiments have been described with reference to the accompanying drawings. It will, however, be evident that various modifications and changes may be made thereto, and additional embodiments may be implemented, without departing from the broader scope of the invention as set forth in the claims that follow. The specification and drawings are accordingly to be regarded in an illustrative rather than restrictive sense.

What is claimed is:

1. A semiconductor package, comprising:
   a substrate;
   a semiconductor device provided on a first portion of a surface of the substrate;
   a stiffener plate provided on a second portion of the surface of the substrate,
      wherein the second portion is separate from the first portion,
      wherein the stiffener plate is configured to be spaced from and to surround the semiconductor device; and
   an electromagnetic interference absorber provided on a third portion of the surface of the substrate,
      wherein the third portion is separate from the first portion and the second portion,
      wherein the electromagnetic interference absorber is configured to be provided between the semiconductor device and the stiffener plate, wherein the electromagnetic interference absorber includes one or more openings to receive one or more corresponding components provided on the surface of the substrate between the stiffener plate and the electromagnetic interference absorber.

2. The semiconductor package of claim 1, wherein the semiconductor device includes one or more of:
an application-specific integrated circuit, or
a memory device.

3. The semiconductor package of claim 1, wherein the electromagnetic interference absorber is configured to absorb electromagnetic interference radiation generated by the semiconductor device.

4. The semiconductor package of claim 1, wherein the electromagnetic interference absorber comprises:
a body portion; and
a main opening provided in the body portion and configured to receive the semiconductor device.

5. The semiconductor package of claim 4, wherein the body portion of the electromagnetic interference absorber is configured to reduce electromagnetic interference radiation, generated by the semiconductor device, from reaching the one or more components provided on the surface of the substrate.

6. The semiconductor package of claim 1, wherein the electromagnetic interference absorber comprises one or more of:
a metal material,
a carbon material,
a ceramic material,
a cement material,
a polymer material, or
a hybrid material.

7. The semiconductor package of claim 1, wherein the electromagnetic interference absorber is configured to block electromagnetic interference radiation at a frequency in a range of approximately two gigahertz to forty gigahertz.

8. The semiconductor package of claim 1, wherein the semiconductor package is a lidless application-specific integrated circuit package.

9. The semiconductor package of claim 1, wherein the electromagnetic interference absorber is configured to block at least ten decibels more of electromagnetic interference radiation than a package without the electromagnetic interference absorber.

10. The semiconductor package of claim 1, wherein a thickness of the electromagnetic interference absorber is dependent upon a quantity of electromagnetic interference radiation to be generated by the semiconductor device.

11. An electromagnetic interference absorber for a semiconductor package, the electromagnetic interference absorber comprising:
a body portion configured to be provided on a first portion of a surface of a substrate that includes a semiconductor device provided on a second portion of the surface of the substrate and a stiffener plate provided on a third portion of the surface of the substrate,
wherein the first portion, the second portion, and the third portion are separate,
wherein the stiffener plate is configured to be spaced from and to surround the semiconductor device,
wherein the body portion is configured to be provided between the semiconductor device and the stiffener plate;
a main opening provided in the body portion and configured to receive the semiconductor device; and
one or more openings to receive one or more corresponding components provided on the surface of the substrate between the stiffener plate and the electromagnetic interference absorber.

12. The electromagnetic interference absorber of claim 11, wherein the semiconductor device includes one or more of:
an application-specific integrated circuit, or
a memory device.

13. The electromagnetic interference absorber of claim 11, wherein the body portion is configured to absorb electromagnetic interference radiation generated by the semiconductor device.

14. The electromagnetic interference absorber of claim 11, wherein the body portion of the electromagnetic interference absorber is configured to reduce electromagnetic interference radiation, generated by the semiconductor device, from reaching the one or more components provided on the surface of the substrate.

15. The electromagnetic interference absorber of claim 11, wherein the body portion comprises one or more of:
a metal material,
a carbon material,
a ceramic material,
a cement material,
a polymer material, or
a hybrid material.

16. The electromagnetic interference absorber of claim 11, wherein the body portion is configured to block electromagnetic interference radiation at a frequency in a range of approximately two gigahertz to forty gigahertz.

17. The electromagnetic interference absorber of claim 11, wherein the body portion is configured to block at least ten decibels more of electromagnetic interference radiation than a semiconductor package without the electromagnetic interference absorber.

18. The electromagnetic interference absorber of claim 11, wherein a thickness of the body portion is dependent upon a quantity of electromagnetic interference radiation to be generated by the semiconductor device.

19. The electromagnetic interference absorber of claim 11, wherein the semiconductor package is a lidless application-specific integrated circuit package.

20. A semiconductor package, comprising:
a substrate;
an application-specific integrated circuit provided on a first portion of a surface of the substrate;
a memory device provided on a second portion of the surface of the substrate;
a stiffener plate provided on a third portion of the surface of the substrate,
wherein the stiffener plate is configured to be spaced from and to surround the application-specific integrated circuit and the memory device; and
an electromagnetic interference absorber provided on a fourth portion of the surface of the substrate,
wherein the first portion, the second portion, third portion, and fourth portion are separate,
wherein the electromagnetic interference absorber is configured to be provided between the stiffener plate and the application-specific integrated circuit and the memory device,
wherein the electromagnetic interference absorber is configured to surround the application-specific integrated circuit and the memory device and to block electromagnetic interference radiation generated by the application-specific integrated circuit and the memory device, and wherein the electromagnetic interference absorber includes one or more openings to receive one or more corresponding components provided on the surface of the substrate between the stiffener plate and the electromagnetic interference absorber.

\* \* \* \* \*